(12) United States Patent
Nose et al.

(10) Patent No.: US 7,847,595 B2
(45) Date of Patent: Dec. 7, 2010

(54) INPUT CIRCUIT AND SEMICONDUCTOR INTEGRATED CIRCUIT COMPRISING THE INPUT CIRCUIT

(75) Inventors: Koichi Nose, Minato-ku (JP); Masayuki Mizuno, Minato-ku (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/162,236

(22) PCT Filed: Jan. 26, 2007

(86) PCT No.: PCT/JP2007/051252

§ 371 (c)(1),
(2), (4) Date: Mar. 19, 2009

(87) PCT Pub. No.: WO2007/086500

PCT Pub. Date: Aug. 2, 2007

(65) Prior Publication Data
US 2009/0201045 A1 Aug. 13, 2009

(30) Foreign Application Priority Data
Jan. 26, 2006 (JP) .............................. 2006-017794

(51) Int. Cl.
H03K 19/00 (2006.01)
(52) U.S. Cl. .............................. 326/93; 326/28; 326/46
(58) Field of Classification Search .................... 710/71
See application file for complete search history.

(56) References Cited
U.S. PATENT DOCUMENTS
6,393,082 B1 * 5/2002 Nakamura .................. 375/368

7,317,775 B1 * 1/2008 Erhart et al. ................ 375/355
2002/0126108 A1 * 9/2002 Koyama et al. ............. 345/204
2004/0130542 A1 * 7/2004 Tanada ....................... 345/204
2006/0066356 A1 * 3/2006 Murata et al. ................. 326/93

FOREIGN PATENT DOCUMENTS

| JP | 61099993 | 5/1986 |
|---|---|---|
| JP | 07044124 | 2/1995 |
| JP | 08314410 | 11/1996 |
| JP | 09152470 | 6/1997 |
| JP | 10222418 | 8/1998 |
| JP | 11112483 | 4/1999 |
| JP | 2000151423 | 5/2000 |
| JP | 2001117865 | 4/2001 |
| JP | 2002041356 | 2/2002 |
| JP | 2003108516 | 4/2003 |

* cited by examiner

Primary Examiner—Vibol Tan
Assistant Examiner—Jany Tran
(74) Attorney, Agent, or Firm—Sughrue Mion, PLLC

(57) ABSTRACT

A control signal input circuit for supplying control signals to a plurality of controlled circuits comprises N pieces of control signal preservation/output circuits provided one by one corresponding to plural-bit signals for delivering input data as it is when a trigger signal is at a first level, and holding previously delivered output data when the trigger signal is at a second level, and a controlled circuit selector circuit for setting the trigger signal for S pieces of the control signal preservation/output circuits to the first level, and setting the trigger signal for the rest of the control signal preservation/output circuits to the second level.

10 Claims, 15 Drawing Sheets

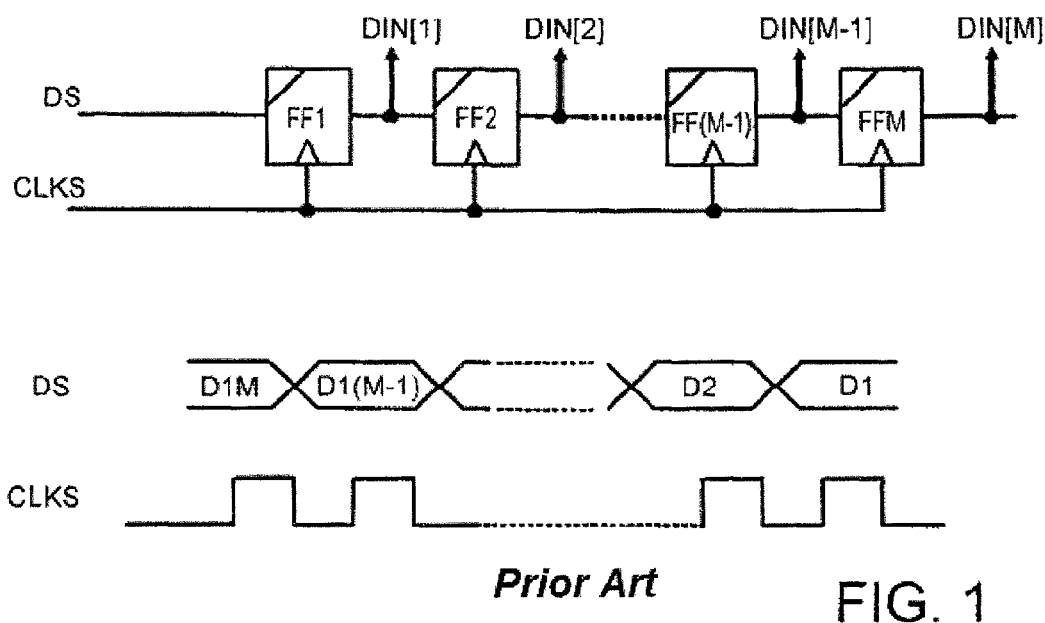
Prior Art  FIG. 1
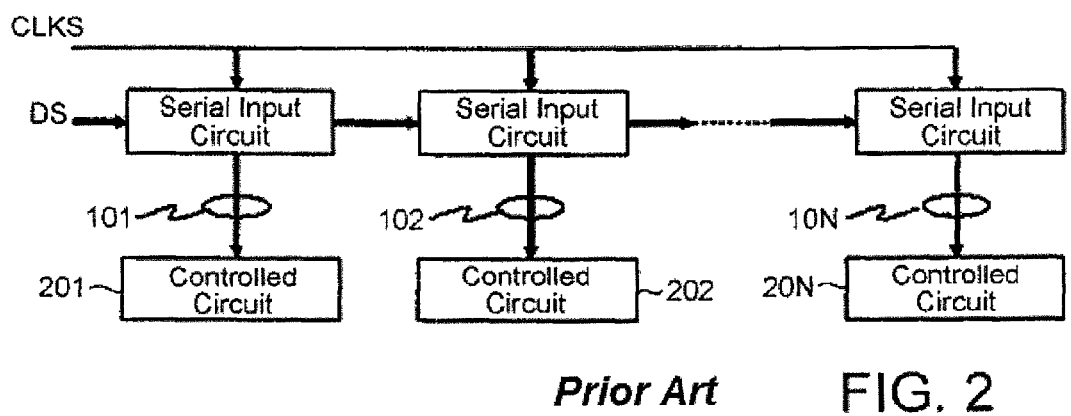
Prior Art  FIG. 2

INPUT CIRCUIT AND SEMICONDUCTOR INTEGRATED CIRCUIT COMPRISING THE INPUT CIRCUIT

TECHNICAL FIELD

The present invention relates to an input circuit provided within a semiconductor integrated circuit and applied with signals from the outside, and more particularly, to an input circuit which can reduce a formation area within the semiconductor integrated circuit, is readily controlled, and can have higher speed for inputting signals, and a semiconductor integrate circuit which comprises such an input circuit.

BACKGROUND ART

In designing of recent large-scaled semiconductor integrated circuits (LSI), a so-called "variation problem" has become prominent, where characteristics of manufactured LSIs deviate from desired characteristics due to the influence of variations and the like of characteristics of transistors which make up the LSIs. As countermeasures to the variation problem, in the designing of an LSI, a number of proposals have been made for the provision of a circuit which includes a correction technique which can correct for deviations from desired values with external control signals after designing and manufacturing. A circuit for such a correction for variations has been widely employed in analog circuits, delay circuits and the like which are largely affected by variations Further, digital signals have been often employed for the external control signals, making it possible to more readily correct for variations.

However, as the variation problem becomes prominent and the design of LSI itself becomes complicated, a large amount of external control signals are required for variation corrections in increasingly more cases. In this event, the external control signals are applied to an LSI chip through control input terminals from the outside of the LSI chip, but due to limitations to the number of I/O (input/output) terminals in an LSI chip, it is increasingly more difficult to directly apply every external control signal individually to the LSI chip from the outside.

Accordingly, in semiconductor integrated circuits, a circuit as shown in FIG. 1, referred to as a serial input circuit, has been widely employed in general as a control signal input circuit such that a large amount of control signals can be applied through a limited number of input terminals. This serial input circuit, though comprising only two input terminals, is a circuit which is capable of outputting N items of control signals. The serial input circuit comprises M pieces of flip-flops FF1 to FFM connected in cascade, i.e., is configured to connect the output of a flip-flop at the previous stage to the input of a flip-flop at the following stage. Here, the two input terminals are an input terminal applied with signal DS, and a clock input terminal applied with clock signal CLKS. The outputs of the flip-flops connected in cascade are labeled DIN[1], DIN[2], ..., DIN[M], respectively.

It is configured that the clock terminal of each flip-flop is commonly supplied with clock signal CLKS. When this serial input circuit is employed, first, desired M pieces of bit signals D11 to D1M are arranged in the order of D1M, ..., D12, D11 in time series to form a serial signal in an input device provided externally to an integrated circuit, and the head of this bit sequence, DIM, is applied to the serial input circuit as signal DS. In other words, DIM is supplied to the input terminal of flip-flop F1 at the first stage. By applying a pulse once as clock signal CLKS, signal DS shifts one bit within the serial input circuit. Next, signal DS is switched to the second bit of the bit sequence within the external input device, and the pulse is applied once to clock input terminal CLKS. By repeating such operations M times, the desired M-bit signal appears at the outputs of M pieces of flip-flops FF1 to FFM in parallel, such as bit D11 appears at output DIN[1], bit D12 appears at output DIN[2], and so on.

The serial input circuits can be mutually connected in cascade at in any number of stages. For example, as shown in FIG. 2, for applying control signals 101 to 10N to N pieces of controlled circuits 201 to 20N, respectively, N pieces of the aforementioned serial input circuits for M bits may be connected in cascade, and among adjacent serial input circuits, DIN[M] at the last stage of a serial input circuit on the previous stage side may be connected to an input portion of signal DS of the serial input circuit on the following stage side. Control signals 101 to 10N are control signals each having a plurality of bits. By configuring such a multi-stage cascade connection, a total number of control signals is increased, and even if the number of controlled circuits (i.e., circuits under control) is increased, control signals can be applied through a small number of input terminals.

However, as a problem in the employment of such a serial input circuit, N×M pieces of flip-flops are required as data holding circuits in order to apply N×M items of control signals, so that when a large number of external control signals must be applied, the serial input circuit occupies a large area within a semiconductor integrated circuit. Also, even when part of a large number of external control signals is to be changed, a serial signal of N×M bits must be generated again, and the generated signals must be applied again to all the flip-flops within the serial input circuit. In this event, problems arise in that a time overhead occurs because the serial signal is applied again, an external input device is required for storing a serial signal of N×M-bits and generating again the serial signal of N×M-bits from all control signals when the control signal is changed, and a control algorithm becomes complicated.

As techniques related to the present invention, Japanese Patent Laid-open Application No. 2002-41356 (JP-A-2002-041356) discloses a semiconductor device which contains a controlled circuit, where a control signal can be supplied to the controlled circuit at high speeds. Japanese Patent Laid-open Application No. 2003-108516 (JP-A-2003-108516) discloses a high-speed bus interface for use in a semiconductor testing apparatus, where the number of bus signal lines can be reduced, and the order of signal lines can be arbitrarily set. In this bus interface, s serial/parallel conversion circuit is provided between an interface unit to an internal circuit and an input stage. Japanese Patent Laid-open Application No. SHO-61-99993 (JP-A-61-099993) discloses a latch circuit which delivers input data as it is when a trigger signal is at a first level, and holds previously delivered output data when the trigger signal is at a second level different from the first level. Japanese Patent Laid-open Application No. Hei-8-314410 (JP-A-8-314410) discloses an enable circuit for use in a driving circuit of a liquid crystal display device, where the enable circuit delivers input data as it is when an enable signal is at a first level, and the level of the output goes to a second level when the enable signal is at the second level. Japanese Patent Laid-open Application No. Hei-9-152470 (JP-A-9-152470) discloses a circuit for use in an integrated circuit testing apparatus and for converting a high-speed serial signal to a low-speed parallel signal. Japanese Patent Laid-open Application No. Hei-10-222418 (JP-A-10-222418) discloses a configuration which can make a write time to a non-volatile memory provided within a microprocessor equal to a machine cycle of the microprocessor.

The documents cited in this specification are enumerated below:
Patent Literature 1: JP-A-2002-041356,
Patent Literature 2: JP-A-2003-108516,
Patent Literature 3: JP-A-61-099993,
Patent Literature 4: JP-A-8-314410,
Patent Literature 5: JP-A-9-152470,
Patent Literature 6: JP-A-10-222418.

DISCLOSURE OF THE INVENTION

Problem to be Solved by the Invention

As described above, the conventional serial input circuit has problems in that the circuit scale becomes larger when a larger amount of external control signals are applied, and all external control signals must be input again even when part of a large number of external control signals is to be changed.

It is an object of the present invention to provide an input circuit which is capable of improving a switching speed, reducing the number of control signals which must be externally stored and generated for input, and reducing an area occupied within a semiconductor integrated circuit.

It is another object of the present invention to provide a semiconductor integrated circuit which is occupied in a reduced area by an input circuit, improves a switching speed of control signals, and is capable of reducing the number of control signals which must be externally stored and generated for input.

Means for Solving the Problems

The object of the present invention is achieved by an input circuit for delivering N pieces of plural-bit signals each comprised of a signal of a plurality of bits, based on input data. The input circuit comprises: N pieces of control signal preservation/output circuits provided one by one corresponding to the plural-bit signals for delivering the input data as it is when a trigger signal is at a first level, and holding the previously delivered output data when the trigger signal is at a second level different from the first level, thereby enabling switching and preservation of the plural-bit signals; and a controlled circuit selector circuit for setting the trigger signal for S pieces of the control signal preservation/output circuits to the first level, and setting the trigger signal for the rest (N-S) pieces of control signal preservation/output circuits to the second level, wherein a group of input signals are supplied in common to the N pieces of control signal preservation/output circuits, corresponding to the input data.

The input circuit according to the present invention may further comprise a serial input circuit which receives input data as serial data, and converts the input data to parallel data to generate a group of input signals.

The other object of the present invention is achieved by a semiconductor integrated circuit which comprises: the input circuit according to the present invention described above; and a controlled circuit, wherein the controlled circuit is changed in characteristics in accordance with a control signal supplied to the controlled circuit.

In this semiconductor integrated circuit, preferably, the N pieces of controlled circuits are supplied with respective optimal control signals by sequentially repeating, for the N pieces of control signal preservation/output circuits, a process of setting the trigger signal to any one of the control signal preservation/output circuits to the first level, changing the control signal for the controlled circuit corresponding to that control signal preservation/output circuits by switching the group of input signals, while observing characteristics of the controlled circuit, to determine an optimal control signal for that controlled circuit, and setting the trigger signal to that control signal preservation/output circuits to the second level after the determination.

In the configuration of the present invention, when a control signal for a particular controlled circuit is adjusted, it can be assured that control signals other than that control signal do not change even if a data input signal is switched, so that the other control signals do not change when only a control signal for a certain controlled circuit is changed, thus eliminating the need for generating and inputting again all the control signals. In this way, a signal which must be generated and supplied again each time a control signal is changed is only that control signal. Conventionally, M×N pieces of data input signals must be applied each time any control signal is changed, whereas according to the configuration of the present invention, since the number of data input signals can be reduced to M, the control signals can be applied at higher speeds as compared with conventional ones.

In the conventional configuration, since M×N pieces of information must be all stored and applied again when control signals for controlled circuits are adjusted, a memory of M×N bits must be additionally provided on-chip, and an increase in area occupied by such a memory becomes a problem particularly when the states of controlled circuits are controlled on-chip. However, according to the present invention, when a control signal to a k-th controlled circuit is adjusted, states other than that control signal need not be stored, thus making it possible to reduce an area occupied by the input circuit.

Specifically, the input circuit of the present invention employs a structure which allows control signals for controlled circuits other than the k-th one to remain unswitched upon selection of the control signal for the k-th controlled circuit. As a result, this input circuit improves a switching speed, can reduce the number of signals which should be externally stored and generated as signals which should be supplied to the input circuit, and can readily conduct the control. Further, this input circuit can reduce the circuit scale, and can therefore reduce an area occupied thereby within a semiconductor integrated circuit.

In the input circuit of the present invention, the number of terminals for input signals can be reduced to two by providing a serial input circuit which is a serial/parallel conversion circuit for a group of input signals.

In case of using the input circuit according to the present invention, while a control signal for a particular controlled circuit is being adjusted, when the control signal is replaced with a more suitable value in accordance with the response of the controlled circuit, a data input signal may simply switched to that value to reflect it to the control signal, and a response of the controlled circuit can be confirmed. By repeating this an arbitrary number of times, an optimal value can be determined for the control signal for the particular controlled circuit. In this event, it is not necessary to generate and supply again control signals other than the control signal for the particular controlled circuit.

BRIEF DESCRIPTION OF THE DRAWINGS

FIG. 1 is a block diagram showing an exemplary configuration of a conventional control signal input circuit;

FIG. 2 is a block diagram showing an example in which the control signal input circuits shown in FIG. 1 are connected in series;

Figure 3:
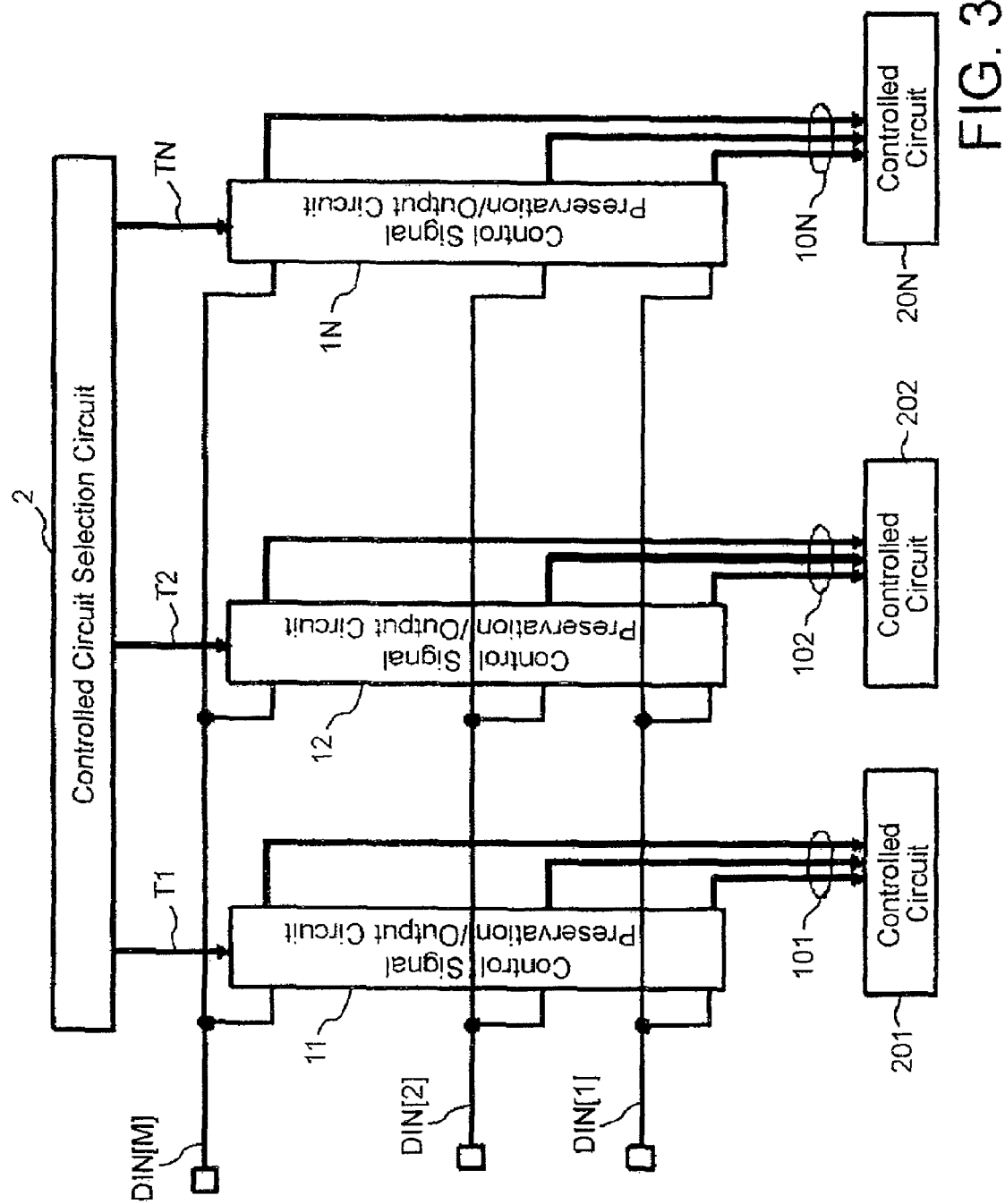
FIG. 3 is a block diagram showing the configuration of a control signal input circuit according to a first exemplary embodiment of the present invention.

| Description of reference numerals | |
|---|---|
| 11 to 1N | Control Signal Preservation/Output Circuits; |
| 2 | Controlled Circuit Selection Signal; |
| 101 to 10N | Control Signals; |
| 201 to 20N | Controlled Circuits; |
| 21 | Serial Input Circuit; |
| 301 to 30N | Delay Elements; |
| 51 | Enable Circuit; |
| 511 to 51M | Delay Variation Correction Signals; |
| 811 to 81M | Capacitive Elements; |
| 821 to 82M | NMOS Transistors; |
| 310 | Delay Circuit Input Signal; |
| 321 | Up/Down Counter; |
| 710, 711, 712 | Delay Elements; |
| 720, 721, 722 | Delay Element Output Terminals; |
| 831, 832 | MOS Inverters; |
| 901 | Selector Circuit; |
| 902 | Gating Circuit; |
| 903 | AND Circuit; |
| 911 to 914 | Set of Latch Circuits; |
| C0, C1, C2 | Phase Comparator Circuits; |
| CLK | Clock Signal (Clock signal for controlled circuit selector circuit); |
| CLSK | Clock signal for Serial Input Circuit; |
| D1 to D5 | Control Signals; |
| DIN[1] to DIN[M] | Input Signals; |
| DS | Input Signal for Serial Input Circuit; |
| F1 to FN, FF1 to FFM | Flip-Flops; |
| FIX | Delay Correction Complete Signal; |
| L11 to LNM | Latch Circuits; |
| TRIG | Trigger Signal (Operation start signal for controlled circuit selector circuit). |

BEST MODE FOR CARRYING OUT THE INVENTION

Next, preferred exemplary embodiments of the present invention will be described with reference to the drawings.

First Exemplary Embodiment

FIG. 3 is a block diagram showing the configuration of an input circuit of a first exemplary embodiment according to the present invention. In the first exemplary embodiment, a description will be given of an approach of applying control signals.

This input circuit is provided within a semiconductor integrated circuit such as LSI, and is used to apply control signals to N pieces of controlled circuits 201 to 20N within the semiconductor integrated circuit, where N is an integer number equal to or larger than two. Control signal preservation/output circuits 11 to 1N are provided one by one for respective controlled circuits 201 to 20N, where signals having a plurality of bits are delivered from control signal preservation/output circuits 11 to 1N to corresponding controlled circuits 201 to 20N, respectively, as control signals 101 to 10N. Control signal preservation/output circuits 11 to 1N are applied with input signals DIN[1] to DIN[M] in common. Then, controlled circuit selector circuit 2 is provided for selecting control signal preservation/output circuits 11 to 1N, in other words, controlled circuits 201 to 20N which are destinations of the control signals.

In the input circuit, controlled circuit selector circuit 2 changes a trigger signal to a first level to select a control signal preservation/output circuit which is first desired for control, and the output of the selected control signal preservation/output circuit is switched by input signals DIN[1], DIN[2], . . . , DIN[M], thereby determining an appropriate control signal which should be delivered to a corresponding controlled circuit. In this event, control signal preservation/output circuits which have not been selected maintain the same outputs irrespective of the value of input signal DIN. Subsequently, after the output of the control signal preservation/output circuit which is first desired for control is determined to a desired value, the trigger signal is changed to the first level, thereby selecting a control signal preservation/output circuit which is next desired for control, followed by determination of the output of the control signal preservation/output circuit. In the following, such a control is repeated to eventually optimize control signals to N pieces of controlled circuits 201 to 20N.

Figure 4:
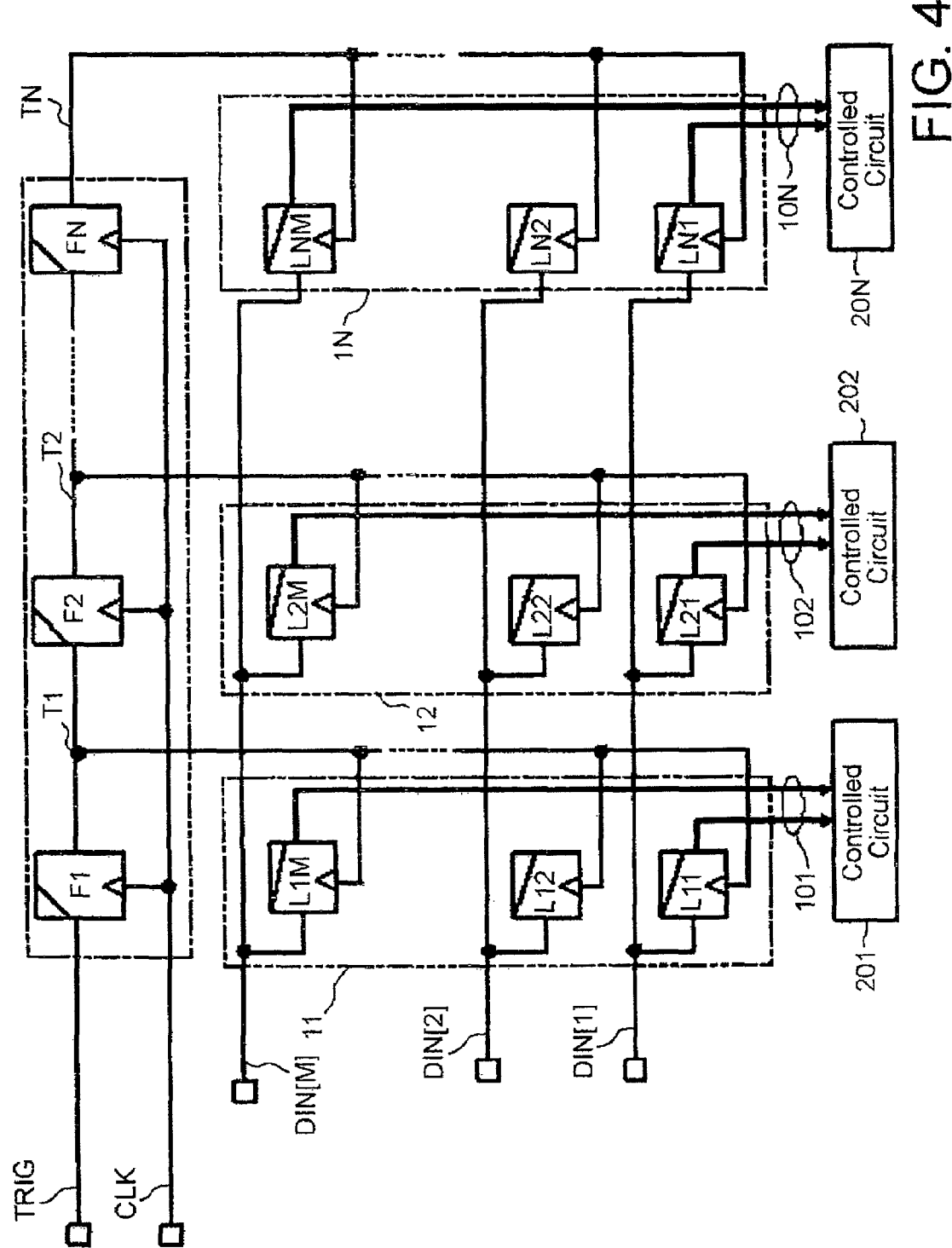
FIG. 4 is a block diagram showing details of the configuration of the control signal input circuit shown in FIG. 3.

FIG. 4 shows details of the configuration shown in FIG. 3. In the following, the input circuit of the first exemplary embodiment will be described in detail with reference to FIG. 4.

Controlled circuit selector circuit 2 is comprised of N pieces of flip-flops F1 to FN which are connected in cascade, where clock input terminals F1 to FN of these N pieces of flip-flops are all supplied with the same clock signal CLK. Assuming 1<k≦N, the input of a k-th flip-flop is connected to the output of a (k−1)th flip-flop. Trigger signal TRIG is supplied to the input of the first flip-flop F1. Signals delivered by flip-flops F1 to FN are represented by T1 to TN, respectively. Signals T1 to TN are used as trigger signals for control signal preservation/output circuits 11 to 1N, respectively.

Figure 5:
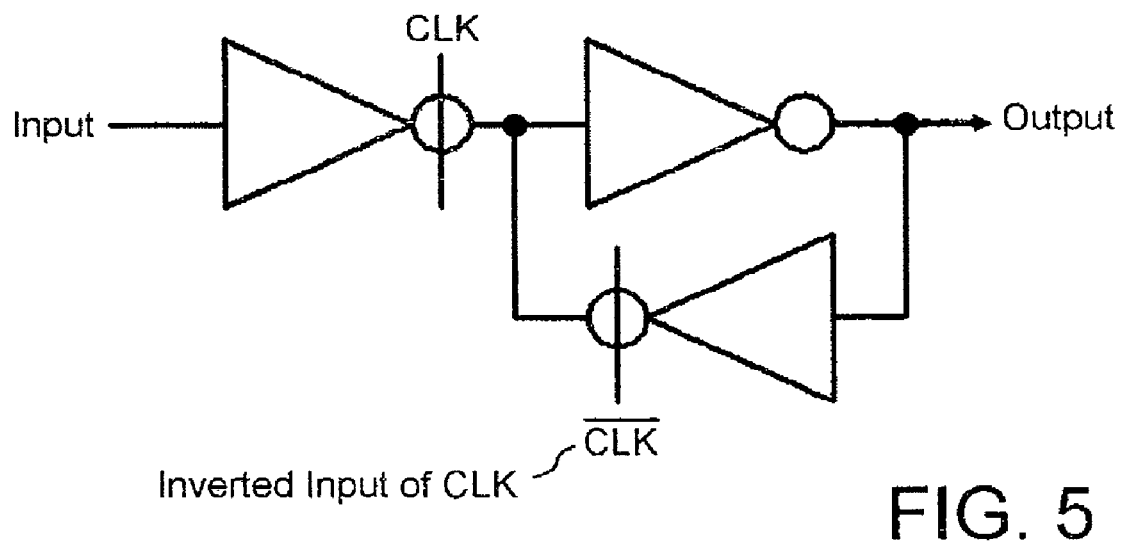
FIG. 5 is a circuit diagram showing an exemplary configuration of a latch circuit used in the control signal input circuit.

Each of control signal preservation/output circuits 11 to 1N comprises M pieces of latch circuits L11 to L1M, L21 to L2M, . . . , LN1 to LNM, which are applied with input signals DIN[1], DIN[2], . . . DIN[N], respectively. These latch circuits, as shown in FIG. 5, comprise a normal inverter circuit, and two inverter circuits, the output of which is controlled by clock signal CLK, and are in a general configuration. Clock signal CLK supplied to each of latch circuits Lk1 to LkM within k-th ($1<k\leq N$) control signal preservation/output circuit 1k is signal Tk which is delivered by k-th flip-flop Fk within controlled circuit selector circuit 2. When such clock signal CLK is at high level, an output signal of a latch circuit is the same as an input signal to the latch circuit, whereas when clock signal is at low level, the output signal of the latch circuit maintains a value when the clock signal CLK has been previously at high level, as it is, irrespective of the input signal to the latch circuit. Then, the output of each latch circuit Lk1 to LkM of k-th control signal preservation/output circuit 1k is applied to k-th controlled circuit 20k as control signal 10k, and the characteristics of controlled circuit 20k can be changed by changing control signal 10k.

Figure 6:
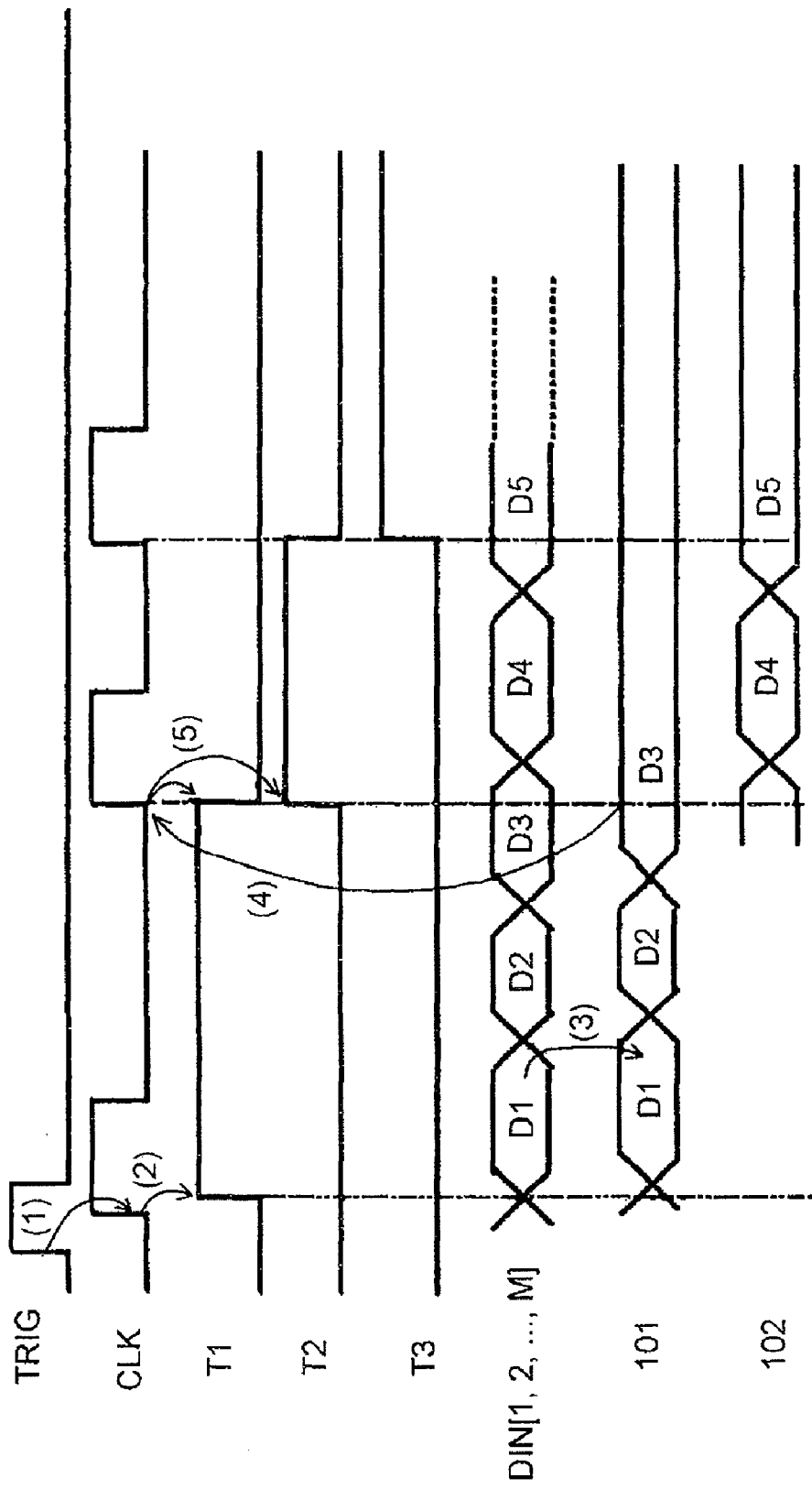
FIG. 6 is a timing diagram showing the basic operation of the control signal input circuit shown in FIG. 4.

Next, the operation of this input circuit will be described with reference to FIG. 6.

First, first flip-flop F1 is applied with trigger signal TRIG which is at high level only for a duration equal to one cycle of clock signal CLK as an input start signal. Subsequently, clock signal CLK rises, causing signal T1 to go to high level, and signals T2 to TN to go to low level. In this event, output 101 of first control signal preservation/output circuit 11 is the same as input signal DIN[1], DIN[2], ..., DIN[M]. Accordingly, appropriate control signal D3 for controlled circuit 201 can be searched by switching the values of DIN[1], DIN[2], ..., DIN[M] to D1, D2, ..., DM to change the characteristics of controlled circuit 201, and observing the influence resulting from the changed characteristics. After determining optimal control signal 101, CLK signal is output for one pulse. This causes signal T1 to go to low level, and signal T2 to go to high level. Subsequently, output 102 of second control signal preservation/output circuit 12 is the same as input signal DIN[1], DIN[2], ..., DIN[M], so that control signal D5 can be searched such that controlled circuit 202 is optimized. On the other hand, the output of first control signal preservation/output circuit 11 is constant irrespective of the input signal, controlled circuit 201 is continuously supplied with previously determined optimal control signal D3. By conducting such a control N times, it is possible to search up to a control signal which results in the optimization of N-th controlled circuit 20N.

In the input circuit of the first exemplary embodiment, signals applied as input signal DIN[1], DIN[2], ..., DIN[M] are only control signals for one controlled circuit selected by controlled circuit selector circuit 2 at all times. Therefore, when this input circuit is used, control signals need not be again applied for controlled circuits which are not selected each time input signals DIN are changed. Also, the size of a latch circuit is approximately one-half the size of a flip-flop, when it is provided in a semiconductor integrated circuit, an input circuit which occupies a smaller area within a semiconductor integrated circuit can be realized than a conventional serial input circuit which uses N×M pieces of flip-flops, according to this exemplary embodiment.

The input circuit of the first exemplary embodiment is particularly effective when optimal control signals can be determined for each controlled circuit independently of one another. Specifically, this input circuit is particularly effective for the case where the control of first controlled circuit 201 is realized only by control signal 101; the control of second controlled circuit 202 is realized by the state of controlled circuit 201 and control signal 102; and the control of controlled circuit 20N is determined by the states of controlled circuits 201 to 20(N−1) and control signal 10N.

EXAMPLE 1

Figure 7:
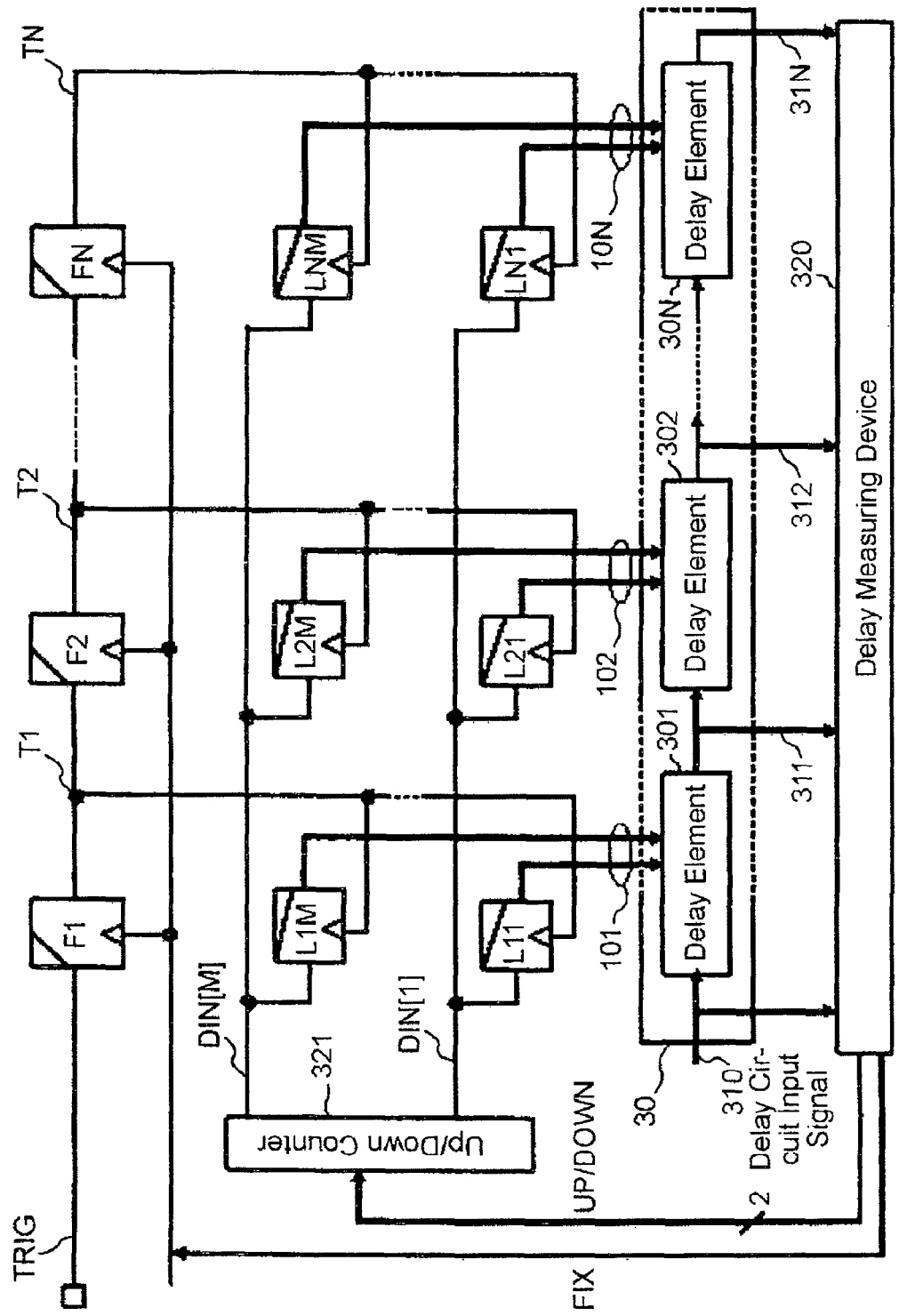
FIG. 7 is a block diagram showing another exemplary configuration of the control signal input circuit of the first exemplary embodiment.

In the following, referring to FIG. 7, as an exemplary application of the first exemplary embodiment, a description will be given of an equal interval delay generator circuit for generating N pieces of signals having a delay difference at equal intervals, wherein the first exemplary embodiment is applied to an input circuit which is used to correct for variations among N pieces of signals to be generated.

Figure 8:
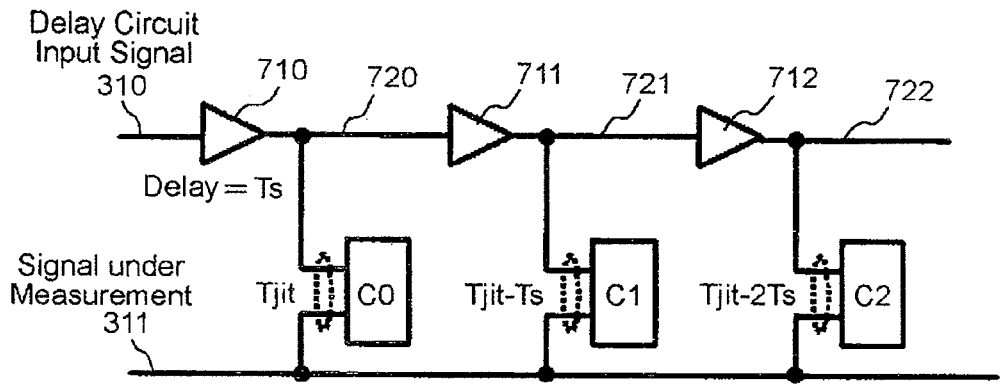
FIG. 8 is a circuit diagram showing an exemplary configuration of a delay measuring device used in the control signal input circuit shown in FIG. 7.

Equal interval delay generator circuit 30 is a circuit for outputting N pieces of output signals 311 to 31N such that a delay in output signal 31k of k-th delay element 30k with respect to delay circuit input signal 310 is equal to time k×T, where T is a fixed value. Equal interval delay generator circuit 30 comprises N pieces of delay elements 301 to 30N connected in cascade. Also, delay measuring device 320 is provided for measuring a delay difference between the output of each delay element and delay circuit input signal 310. Delay measuring device 320 is comprised of a delay difference measuring circuit, for example, as shown in FIG. 8. Delay measuring device 320 comprises a plurality of delay elements 710, 711, 712, ..., connected in cascade, each of which has a delay time of $T_s$, in order to measure a time difference between delay circuit input signal 310 and a signal under measurement, where output 311 of delay element 301 is chosen to be the signal under measurement. Then, in delay measuring device 320, a rising signal of delay circuit input signal 310 is passed to delay elements 710, 711, 712, ... in sequence to generate signals 720, 721, 722, ... which differ from one another in the timing of the rising signal by $T_s$. The timings of these signals 720, 721, 722 are compared with the timing of signal 311 under measurement by phase comparator circuits C0, C1, C2, ..., and a time difference between delay circuit input signal 310 and signal 311 under measurement can be represented by $P \times T_s$, where P is the number of phase comparator circuits which determine that the signal under measurement delays in timing.

Figure 9:
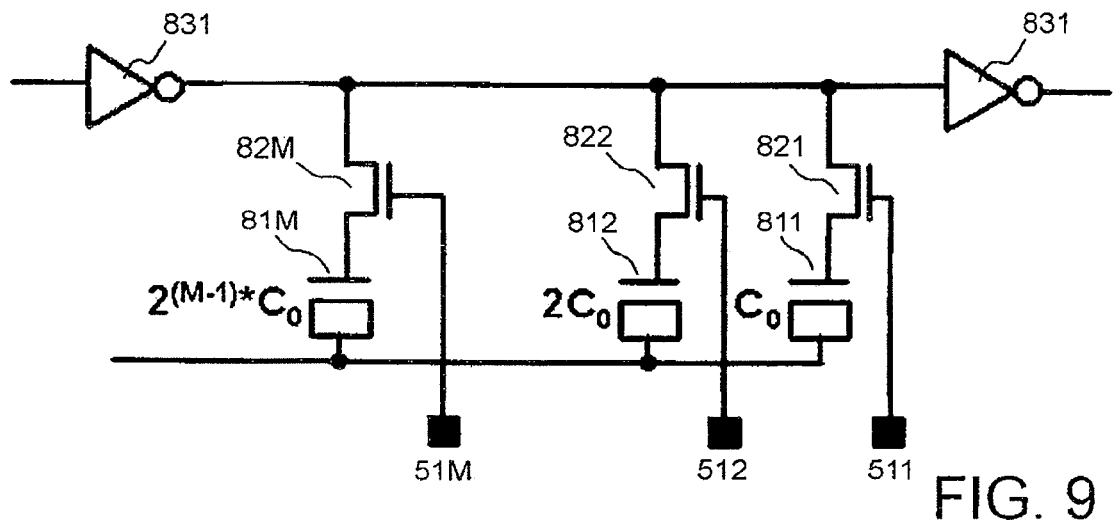
FIG. 9 is a circuit diagram showing an exemplary configuration of a delay element used in the control signal input circuit shown in FIG. 7.

Delay measuring device 320 can also be realized by taking the signals out of the chip, and observing waveforms with an oscilloscope, other than that described above. The delay elements (delay circuits) used in delay measuring device 320 are comprised, for example, of a circuit shown in FIG. 9. Specifically, the output of input MOS inverter 831 is connected to the input of output MOS inverter 832. Capacitances, respectively, controlled by delay variation correction signals 511 to 51M, which are M-bit binary data, are connected to lines which connect inverters 831, 832. The M pieces of capacitances have values which sequentially increase in accordance with two's power, such as $C_0, 2C_0, \ldots, 2^{M-1}C_0$, and by controlling switches comprised of NMOS transistors 821 to 82M by correction signals 511 to 51M, respectively, the capacitance value as a whole can be changed from 0 to $(2^M - 1)C_0$ in increments of $C_0$. By employing such a configuration, the delay monotonously increases every $\Delta T$ as the value of delay variation correction signal, which is M-bit binary data, increases.

Referring again to FIG. 7, in this equal interval delay generator circuit, delay correction complete signal FIX applied from delay measuring device 320 is used as a clock signal to each flip-flop F1 to FN of controlled circuit selector circuit 2. First, by setting trigger signal TRIG to high level and delay correction complete signal FIX to high level, signal T1 is set to high level, while signals T2 to TN to low level. Subsequently, trigger signal TRIG and delay correction complete signal FIX are both changed to low level. In this event, a delay by delay element 301 is determined by the values of control signals DIN[1] to DIN[M]. Also, in this event, a delay time difference between delay circuit input signal 310 and first output signal 311 is measured by delay measuring device 320. If the delay is larger than ideal value T, delay measuring device outputs a DOWN signal to up/down counter 321. M-bit up/down counter 321, upon receipt of the DOWN signal, decrements the value of input signal DIN by one. Consequently, the value of control signal 101 to delay element 301 decreases, and the delay decreases by ΔT and approaches to desired delay amount T. Conversely, when the delay is smaller than ideal value T, delay measuring device 320 outputs an UP signal. Up/down counter 321, upon receipt of the UP signal, increments the value of DIN by one. Consequently, the value of control signal 101 to delay element 301 increases, and delay increases by ΔT and approaches to desired delay value T. The UP signal and DOWN signal are also referred to as relay correction signals.

In this way, when delay measuring device 230 determines that the delay element 301 can be set to desired delay value T, delay measuring device 320 changes delay correction complete signal FIX to high level. This causes signal T1 to go to low level and signal T2 to go to high level, so that input signals DIN[1] to DIN[M] are supplied to control terminal 102 of second delay element 302 this time, so that delay element 302 can be corrected for a delay. Since the value of control signal 101 is held while delay element 302 is being corrected for the delay, the delay correction signal need not be applied again for delay element 301. By doing this on per delay element basis, a desired delay value can be set to all delay elements.

When an equal interval delay generator circuit is corrected for variations using a conventional serial input circuit which uses N×M pieces of flip-flops, input signals of N×M bits in total, which should be supplied to the serial input circuit from the outside must be generated again at all times, and an input signal generator circuit of M×N bits is required outside of the serial input circuit. In contrast, in the equal interval delay generator circuit herein described, all delay elements can be corrected only by N×M pieces of latch circuits, and an M-bit up/down counter for controlling only control signals for a pertinent delay element, thus making it possible to largely reduce the area of the input circuit and correct the equal interval delay generator circuit in a short time.

Second Exemplary Embodiment

Next, a description will be given of a control signal input circuit which is additionally provided with a serial input, as a second exemplary embodiment of the present invention.

Figure 10:
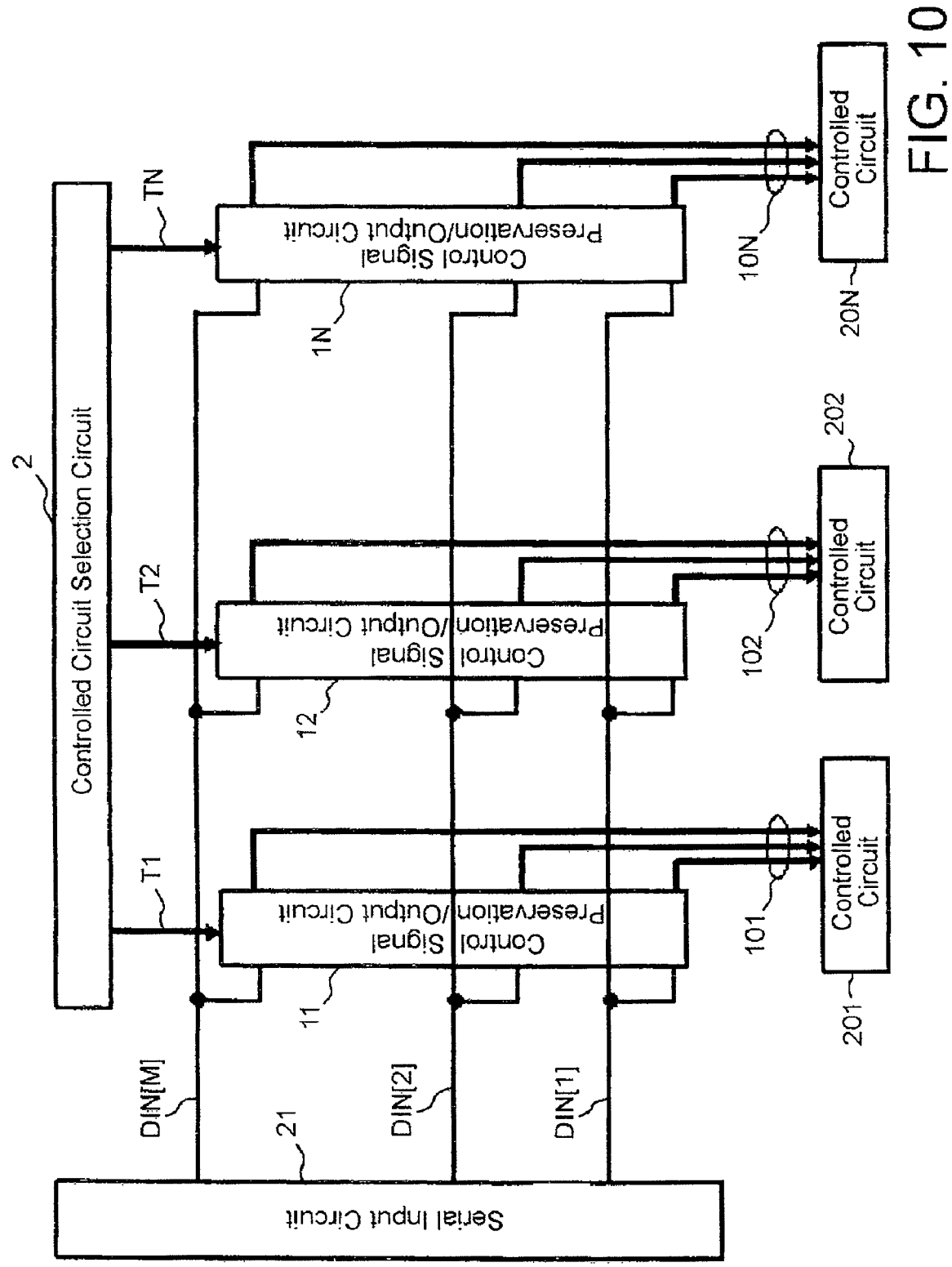
FIG. 10 is a block diagram showing the configuration of a control signal input circuit of a second exemplary embodiment of the present invention.
Figure 11:
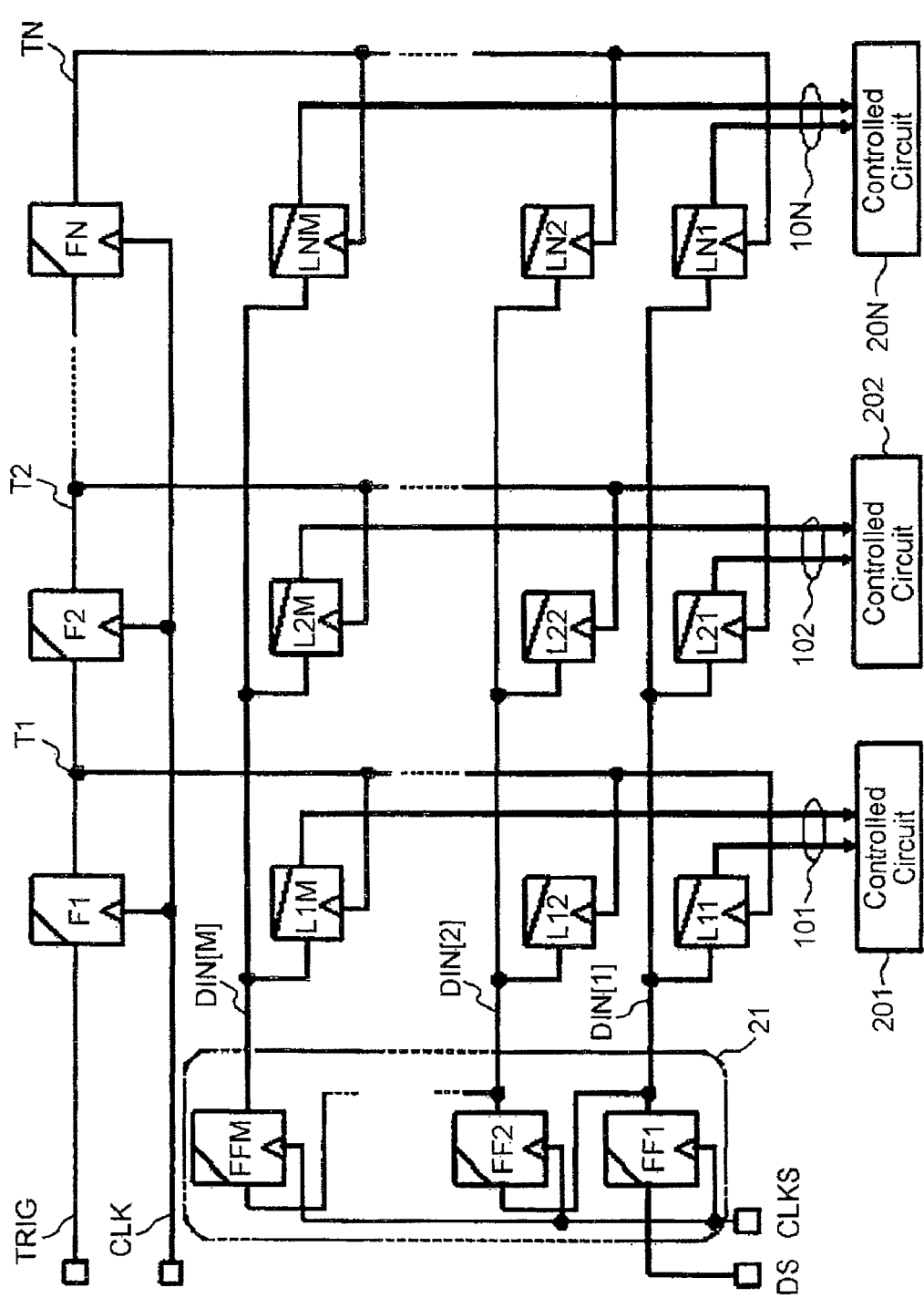
FIG. 11 is a block diagram showing details of the configuration of the control signal input circuit shown in FIG. 10.

While the input circuit of the first exemplary embodiment needs M pieces of input terminals for input signals DIN[1] to DIN[M], the number of terminals for input signals can be reduced from M to two by providing serial input circuit 21 for generating M-bit parallel input signals DIN[1] to DIN[M] from a serial signal of one bit width through serial/parallel (P/S) conversion, as shown in FIG. 10. In this event, assume that input signals DIN[1] to DIN[M] have been previously converted to a serial signal by an external circuit. FIG. 11 shows details of the input circuit of the second exemplary embodiment. In the following, the input circuit of the second exemplary embodiment will be described in detail with reference to FIG. 11.

Serial input circuit 21 comprises M pieces of flip-flops FF1 to FFM which are connected in cascade in such a manner that the output of the previous stage connects to the input of the subsequent stage, and serial circuit input signal DS is supplied to the input of the first stage. Also, serial input circuit clock signal CLKS is supplied to clock inputs of the M pieces of flip-flops.

Figure 12:
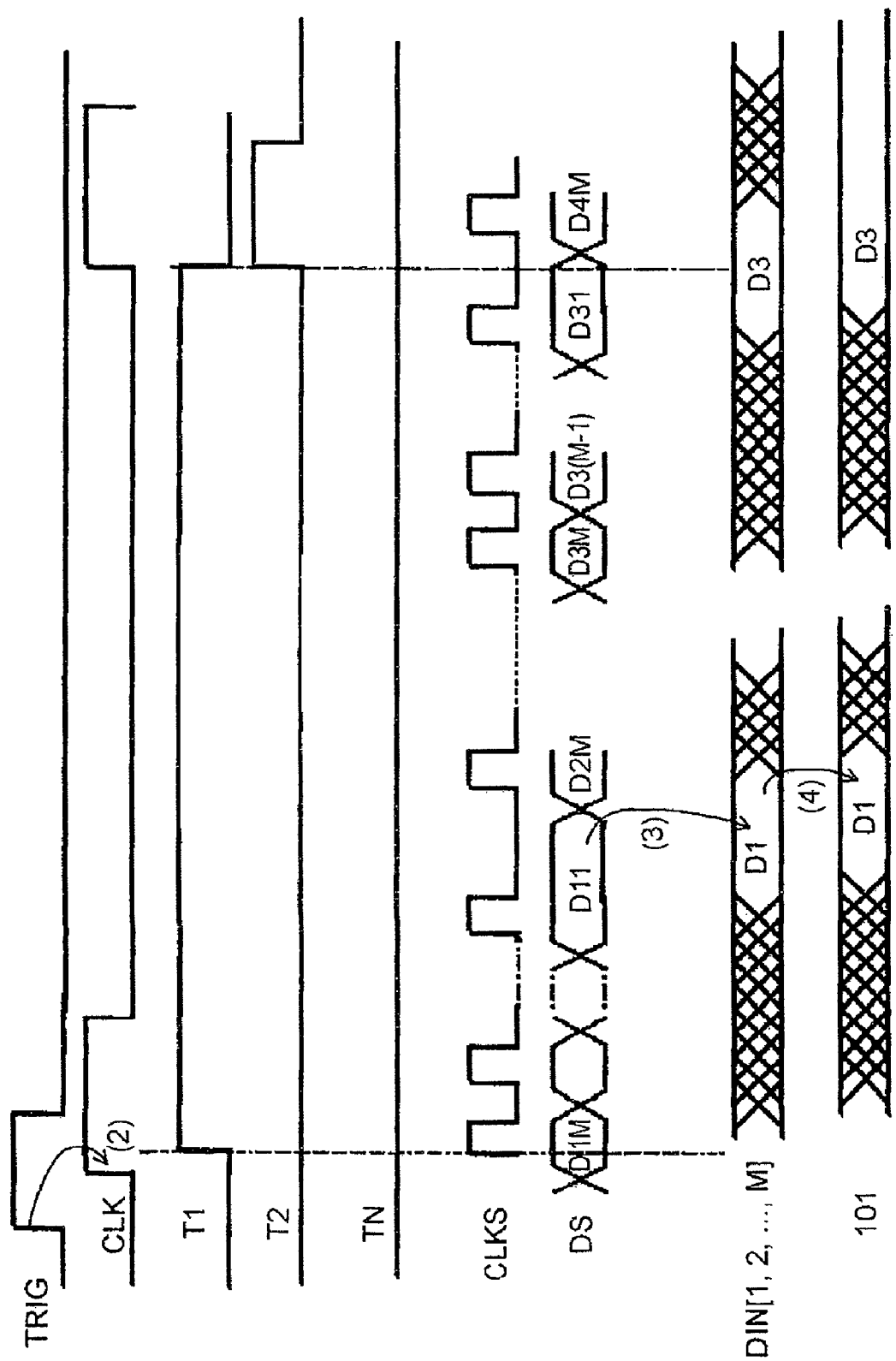
FIG. 12 is a timing diagram showing the basic operation of the control signal input circuit shown in FIG. 10.

Next, the operation of this input circuit will be described with reference to FIG. 12.

First, similar to the first exemplary embodiment, trigger signal TRIG and clock signal CLK are set to high level, causing signal T1 to go to high level. Subsequently, a DIN input signal is generated by serial input circuit 21. First, combination D1 of desired M-bit signals (i.e., a bit sequence of D1M, . . . , D12, D11) is converted to a serial signal which is designated serial circuit input signal DS. One pulse is applied as clock signal CLKS, thereby causing signal DS to shift bit by bit in serial input circuit 21. Repeating this M times, D11 appears at output DIN[1], D12 appears at output DIN[2], and so on. Combination D1 of desired M-bit signals is output as DIN[1] to DIN[M]. Subsequently, control signal 101 for controlled circuit 201 is set to an appropriate value in a manner similar to the first exemplary embodiment.

While the input circuit of the first exemplary embodiment requires (M+2) pieces of input terminals in total, including input terminals of signals for controlled circuit selector circuit 2, the input circuit of the second exemplary embodiment can be configured by four input terminals, and according to this exemplary embodiment, the number of terminals can be more reduced in the input circuit.

Third Exemplary Embodiment

Next, a description will be given of a control signal input circuit which is additionally provided with an enable circuit, as a third exemplary embodiment of the present invention.

Figure 13:
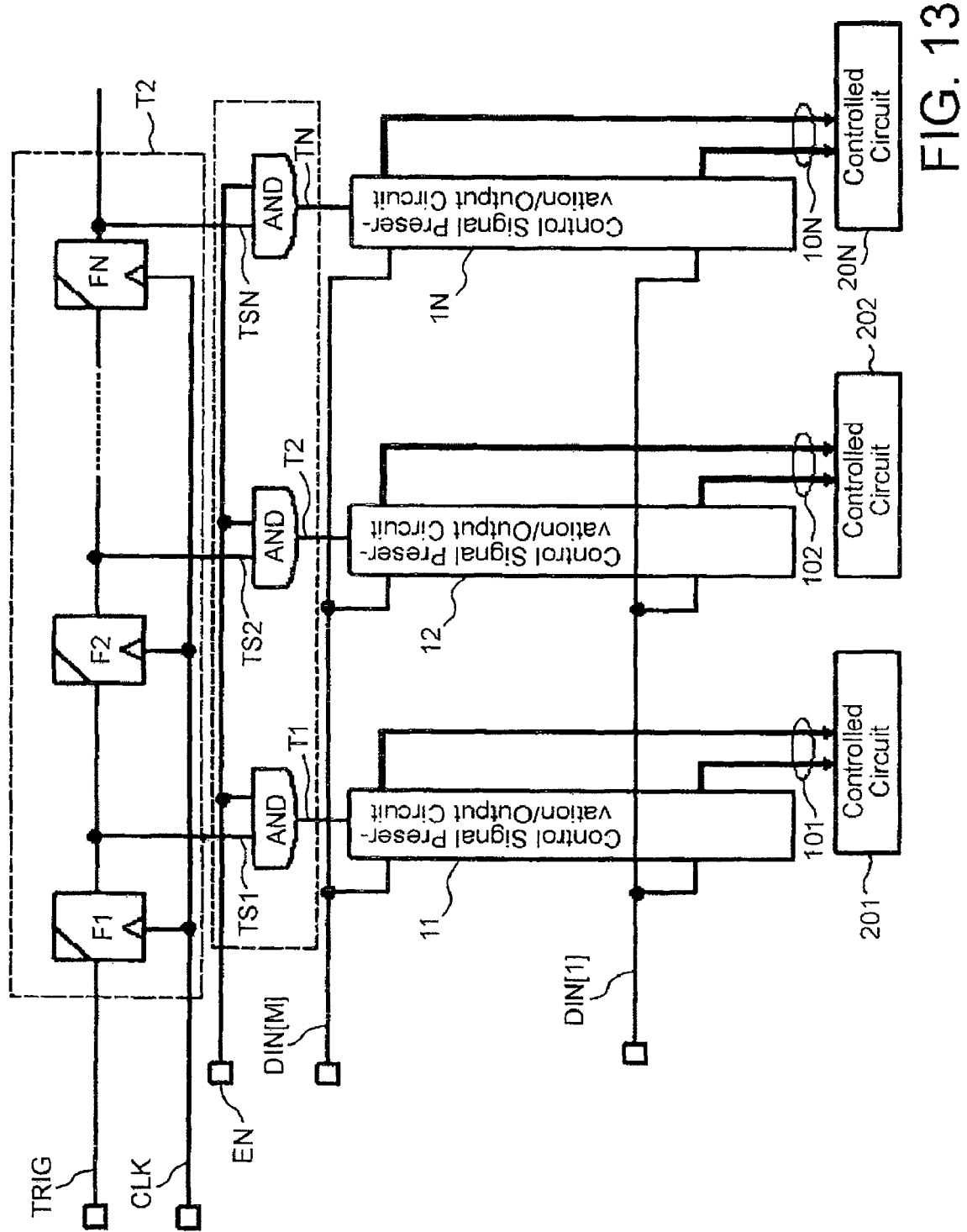
FIG. 13 is a block diagram showing the configuration of a control signal input circuit of a third exemplary embodiment of the present invention.

The control signal input circuit of the third exemplary embodiment shown in FIG. 13 comprises enable circuit 51 between controlled circuit selector circuit 2 and control signal preservation/output circuits 11 to 1N in the input circuit of the first exemplary embodiment.

Controlled circuit selector circuit 2 comprises N pieces of flip-flops F1 to FN, where the same clock signal CLK is supplied to all clock terminals of the respective flip-flops. The input of a k-th flip-flop is connected to the output of a (k−1)th flip-flop. Further, outputs TS1 to TSN of flip-flops F1 to FN are applied to an AND (logical sum) circuit within enable circuit 51. Outputs of the AND circuit are T1 to TN, where these outputs are determined by enable signal EN which is applied to the AND circuit from the outside. Outputs T1 to TN of the AND circuit are supplied to control signal preservation/output circuits 11 to 1N, respectively, as trigger signals.

Figure 14:
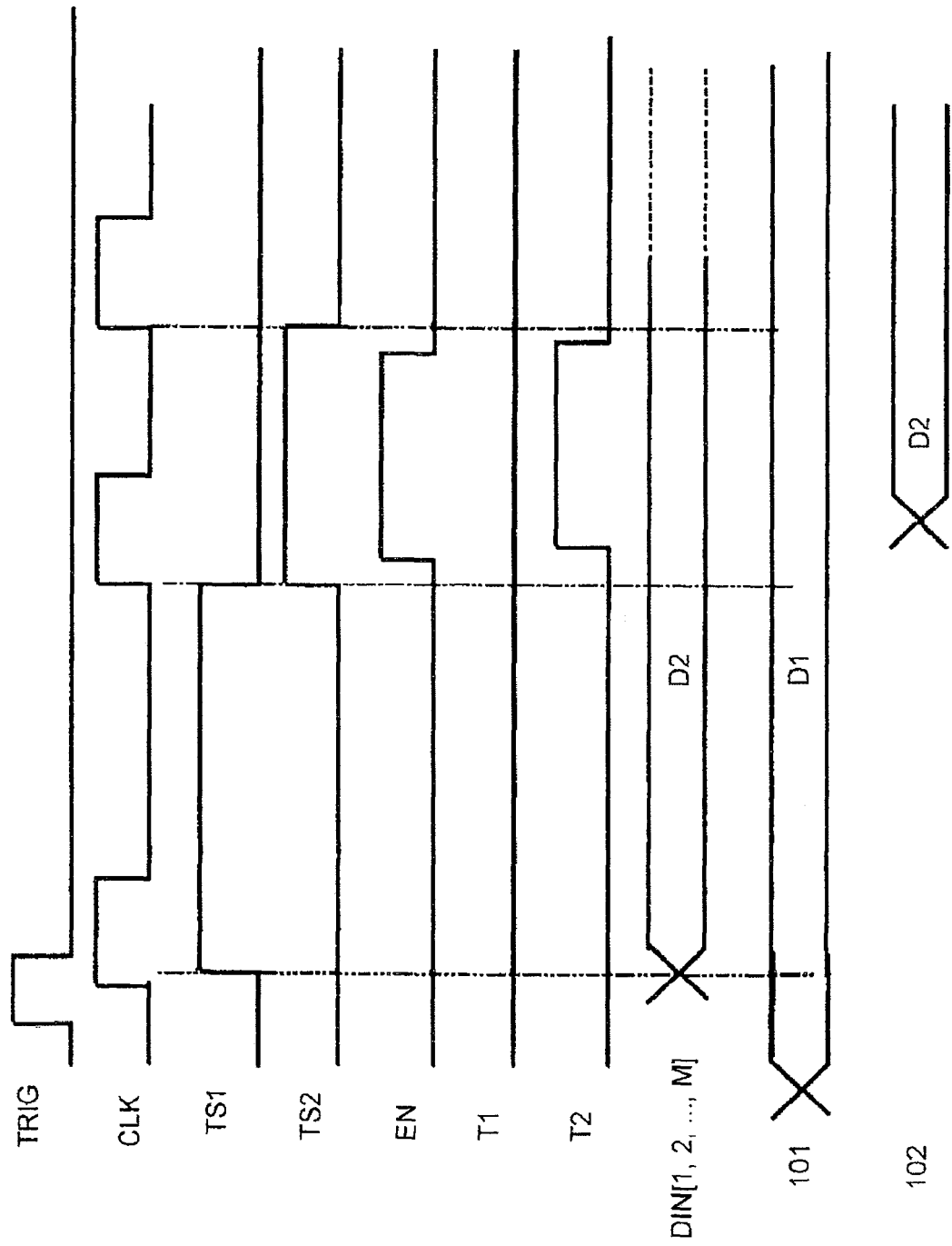
FIG. 14 is a block diagram showing details of the configuration of the control signal input circuit shown in FIG. 13.

By using the input circuit of the third exemplary embodiment, a k-th control signal can be controlled without changing the first control signal through (k−1)th control signal. For example, a description will be given of operations when one wishes to change only a second control signal with reference to FIG. 14. First, first flip-flop F1 is applied with trigger signal TRIG which is at high level only for a duration equal to one cycle of clock signal CLK as an input start signal Subsequently, clock signal CLK rises, causing signal TS1 to go to high level, and signals TS2 to TSN to go to low level. In this event, when enable signal EN has been previously set to low level, first output T1 of the enable circuit goes to low level, and first control signal preservation/output circuit 11 continues to hold value D1 of first control signal 101 which has been previously set. Next, as one pulse of clock signal CLK is output, signal TS1 goes to low level, while signal TS2 goes to high level. Subsequently, by setting enable signal EN to high level, outputs 202 of second control signal preservation/output circuit 12 are the same as input signals DIN[1], DIN[2], .

..., DIN[M], so that control signal D2 can be searched so as to optimize controlled circuit 202. On the other hand, since the control signal delivered from first control signal preservation/output circuit 11 is constant irrespective of the input signal, controlled circuit 201 is continuously applied with previously determined optimal control signal D1.

Figure 15:
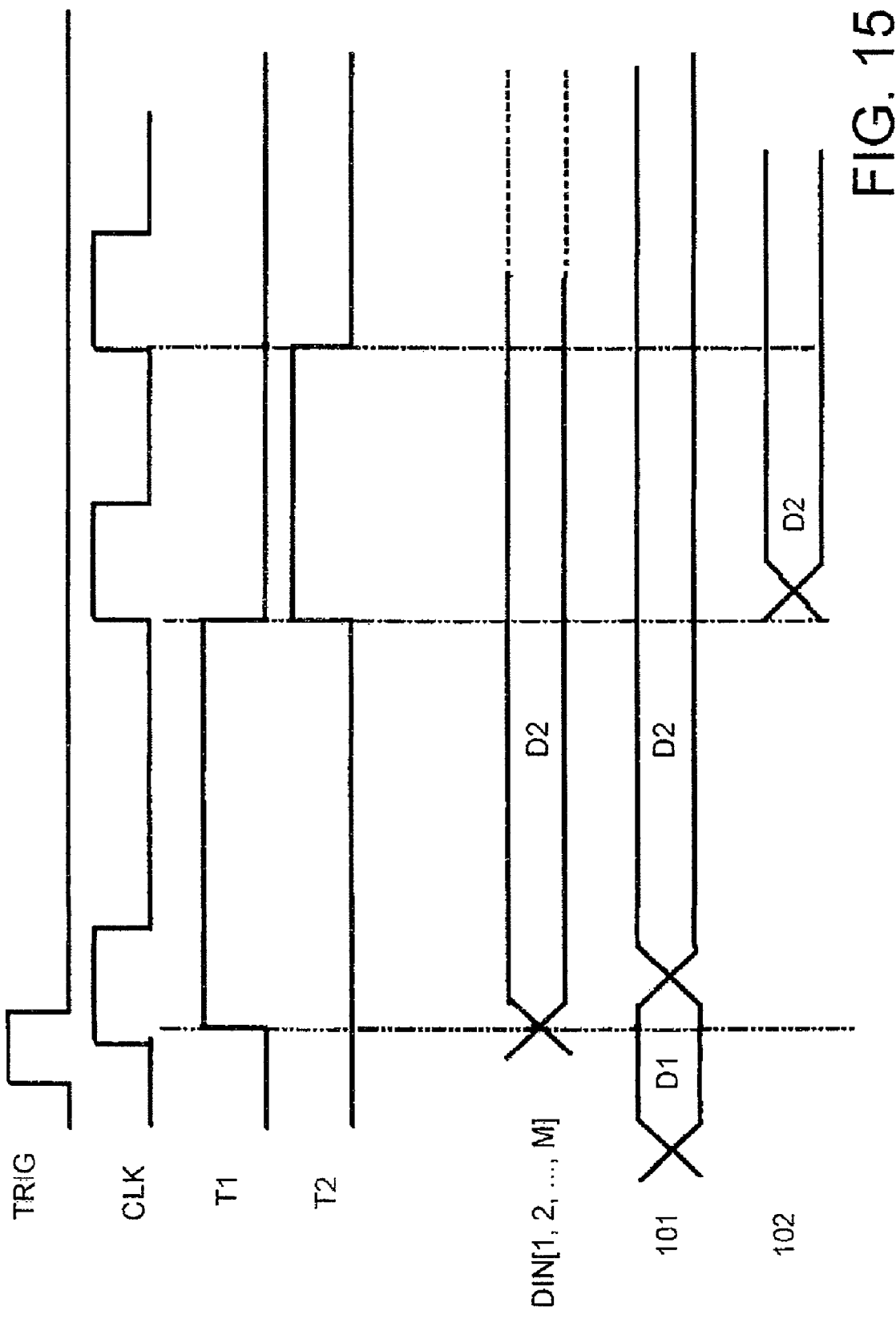
FIG. 15 is a timing diagram showing the basic operation of the control signal input circuit shown in FIG. 14.

Incidentally, in the case of the first exemplary embodiment which does not use enable signal EN, a period is required to set first trigger signal T1 to high level before second trigger signal T2 is set to high level, and previously set first control signal D1 is forcedly switched to control signal D2, as shown in FIG. 15. In contrast, the input circuit of the third exemplary embodiment is characterized by the ability to rewrite a desired control signal without destroying the previously optimized first control signal.

Fourth Exemplary Embodiment

Next, a description will be given of a control signal preservation/output circuit which is additionally provided with a decode circuit, as a control signal input circuit of a fourth exemplary embodiment of the present invention.

Figure 16:
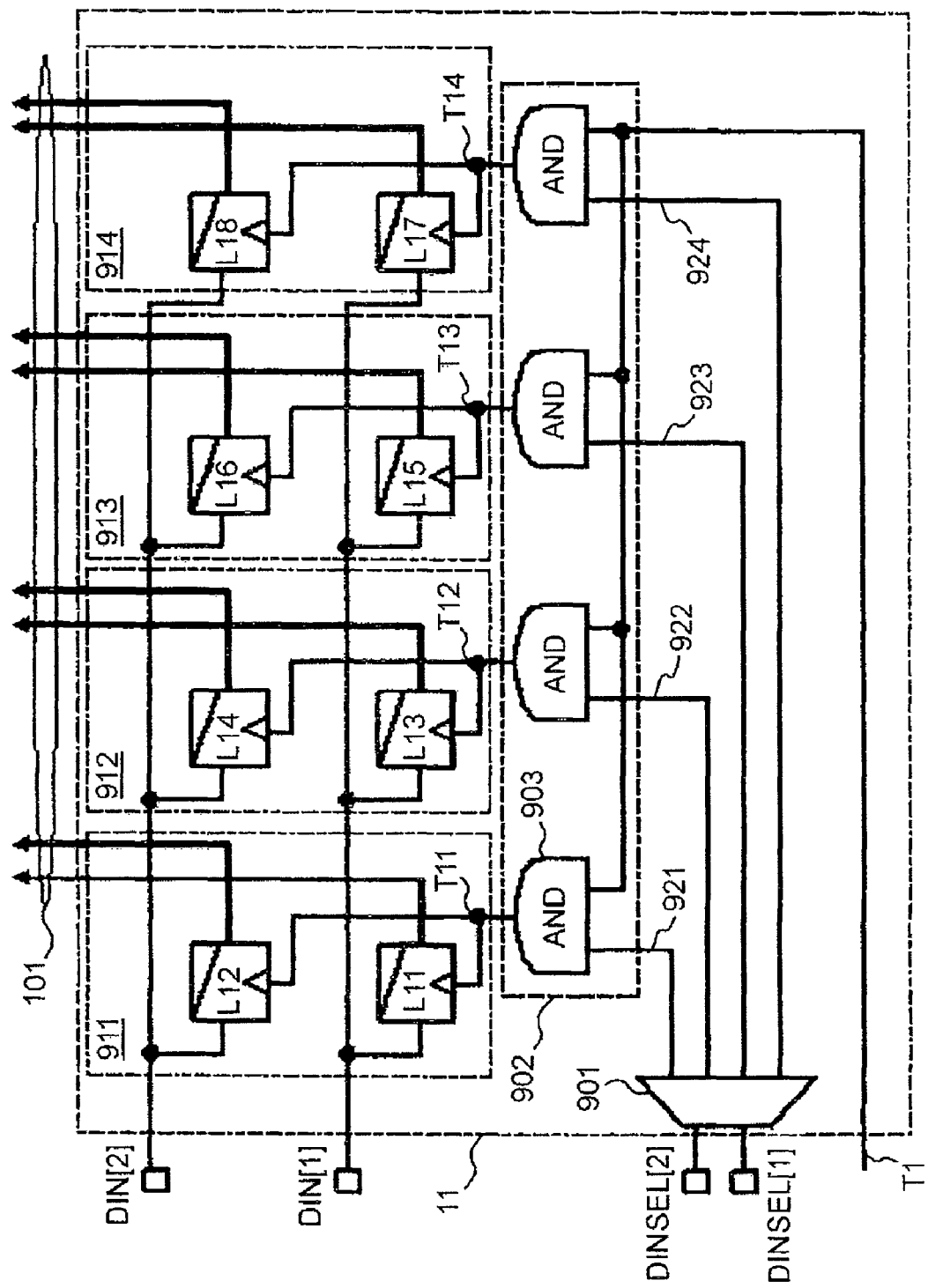
FIG. 16 is a block diagram showing the configuration of a control signal input circuit of a fourth exemplary embodiment of the present invention.

FIG. 16 shows the configuration of the control signal preservation/output circuit in the control signal input circuit of the fourth exemplary embodiment. This circuit comprises a decode circuit which is added to the control signal preservation/output circuit used in the input circuit of each exemplary embodiment described above.

Control signal preservation/output circuit 11 comprises selector circuit 901 for setting only one bit of output signals 921 to 924 to high level in accordance with the value of supplied decode signal DINSEL, gating circuits 902 supplied with the output of selector circuit 901, and a latch circuit divided into a plurality of sets 911 to 914. Gating circuits 902 are provided one by one for sets 911 to 941 of latch circuits, and each comprises AND circuit 903 which is supplied with trigger signal T1. Each AND circuit 903 is a circuit which outputs a corresponding output of selector circuit 901 as it is when trigger signal T1 supplied to control signal preservation/output circuit 11 is at high level, and sets the output to low level when trigger signal T1 is at low level. In sets 911 to 914 of latch circuits, a clock signal to latch circuits is common in a respective set, and an input terminal of the clock signal in each set is connected to different output 921 to 924 of the gating circuit, respectively. Data input terminals of each latch circuit are connected to a group of input signals DIN1, DIN2, respectively.

Figure 17:
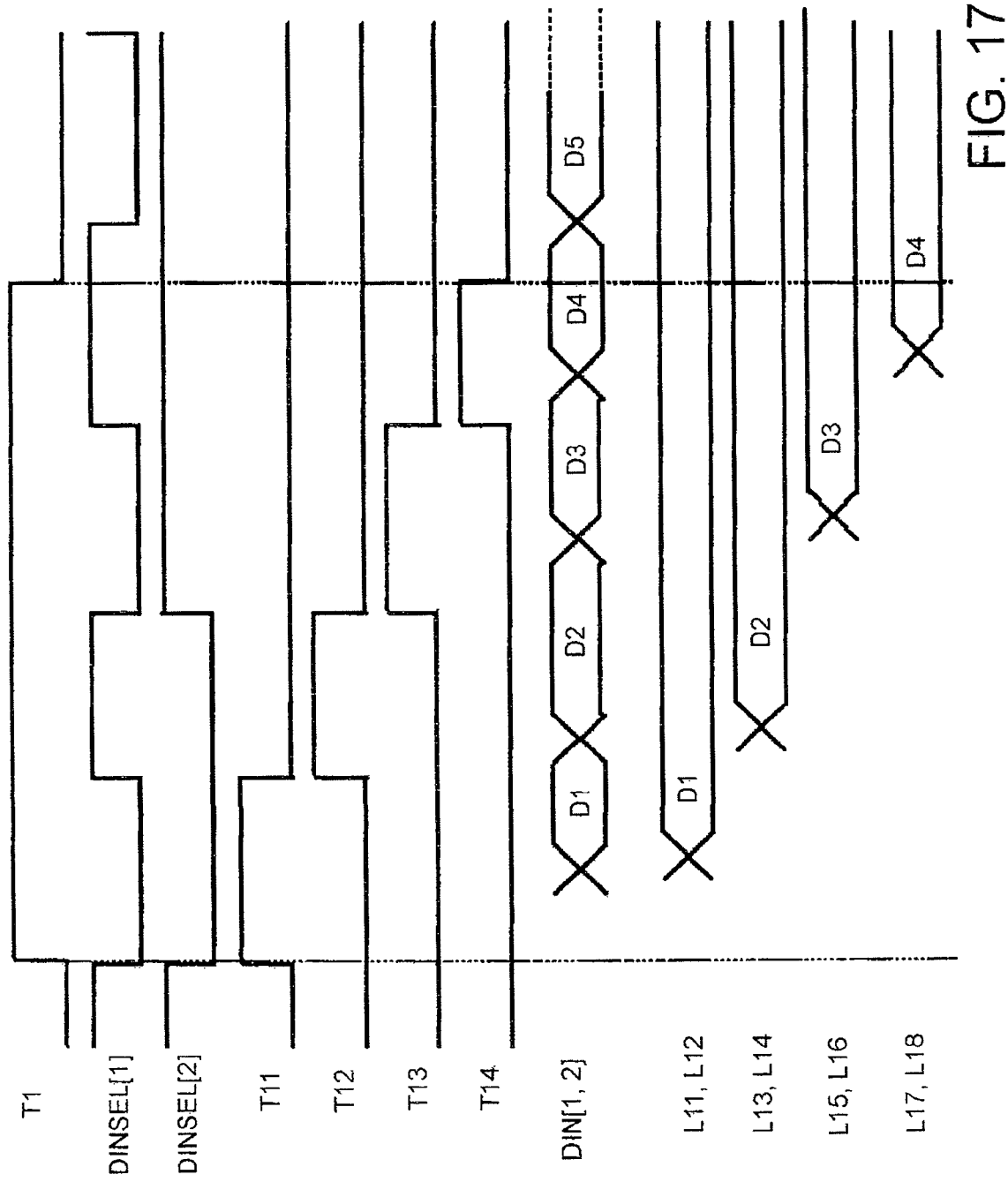
FIG. 17 is a timing diagram showing the basic operation of the control signal input circuit shown in FIG. 16.

Next, the operation of the circuit shown in FIG. 16 will be described with reference to FIG. 17.

While any one of outputs 921 to 924 of selector circuit 901 is "1" without fail in accordance with decode signals DINSEL (DINSEL[1], DINSEL[2]), only one of outputs T11 to T14 of gating circuit 902 goes to high level when control signal preservation/output circuit 11 is selected by controlled circuit selector circuit 2, i.e., only when signal T1 is at high level. For example, if input signal DIN is set to D1 when only output signal T11 of AND circuit 903 corresponding to output 921 is at high level, the outputs of latch circuits L11, L12 within first set 911 also go to D1. Next, when the decode signal is switched, only output T12 is set to high level, and subsequently input signal DIN is set to D2, only latch circuits L13, L14 within second set 912 can be set to D2 without destroying the outputs of latch circuits L11, L12 within first set 911. Similar processing is repeated for latch circuits L15, L16 within third set 913, and latch circuits L17, L18 within fourth set 914.

In the case of a control signal preservation/output circuit comprised of an 8-bit latch circuit, eight input signal lines are required for supplying 8-bit input signal DIN[1] to DIN[8], whereas the fourth exemplary embodiment only requires four signal lines, i.e., two bits of selector signal and two bits of input signal, thus making it possible to reduce the number of signal lines for the control signal preservation/output circuit and consequently reduce the number of input terminals required for the control signal input circuit.

While preferred exemplary embodiments of the present invention have been described above, it is apparent that the present invention is not limited to each exemplary embodiment described above, and each exemplary embodiment can be modified as appropriate within the technical idea of the present invention.

The invention claimed is:

1. An input circuit for delivering N pieces of plural-bit signals each comprised of a signal of a plurality of bits, based on input data, said input circuit comprising:
   N pieces of control signal preservation/output circuits, which are provided
   one by one corresponding to the plural-bit signals, for delivering the input data as it is when a trigger signal to said control signal preservation/output circuits is at a first level, and holding the previously delivered output data when the trigger signal to said control signal preservation/output circuits is at a second level different from the first level, thereby enabling switching and preservation of the plural-bit signals; and
   a controlled circuit selector circuit for setting the trigger signal for S pieces of said control signal preservation/output circuits to the first level, and setting the trigger signal for the rest (N-S) pieces of the control signal preservation/output circuits to the second level,
   wherein a group of input signals are supplied in common to said N pieces of the control signal preservation/output circuits, corresponding to the input data, and
   wherein said each control signal preservation/output circuit comprises:
      a selector circuit for setting only one bit of an S-bit output signal to the first level in accordance with the value of a supplied decode signal;
      a gating circuit applied with an output of said selector circuit for delivering the output of said selector circuit as it is when the trigger signal applied to said control signal preservation/output circuit is at the first level, and setting all the outputs to the second level when the trigger signal is at the second level; and
      a number of latch circuits equal to the number of bits of the plural-bit signal, each for delivering input data as it is when the trigger signal is at the first level, and holding the output data when the trigger signal is at the second level,
   wherein the group of input signals are supplied to input terminals of said latch circuits in parallel.

2. The input circuit according to claim 1, further comprising a serial input circuit which receives the input data as serial data, and converts the input data to parallel data to generate the group of input signals.

3. The input circuit according to claim 1, wherein:
   said N pieces of plural-bit signals are supplied from said N pieces control signal preservation/output circuits to N controlled circuits as control signals, control signals for S pieces of controlled circuits, among said N pieces of controlled circuits, in which control signals to be supplied thereto are desired to be changed are changed by controlling the group of input signals, and control signals for the controlled circuits other than said S pieces of controlled circuits are held irrespective of the values of the group of input signals.

4. The control circuit according to claim 3, wherein the control signals to said N pieces of controlled circuits are made switchable by sequentially repeating for said N pieces of controlled circuits a process of setting the trigger signal to a control signal preservation/output circuit corresponding to any one of the controlled circuits to the first level, changing the control signal for said any one of the controlled circuits by switching the group of input signals, and setting the trigger signal to the control signal preservation/output circuit to the second level after the change.

5. The input circuit according to claim 1, wherein:
said each control signal preservation/output circuit comprises a number of latch circuits, equal to the number of bits of the plural-bit signals, for delivering input data when the trigger signal to the control signal preservation/output circuit is at the first level, and holding output data when the trigger signal to the control signal preservation/output circuit is at the second level,
the trigger signal to the control signal preservation/output circuit is supplied to the latch circuits included in said control signal preservation/output circuit for each of said control signal preservation/output circuits, and
the group of input signals are supplied to input terminals of said latch circuits in parallel.

6. An integrated circuit according to claim 1, wherein:
said controlled circuit selector circuit comprises an operational circuit having an N-bit output, wherein K pieces of outputs are set to the first level in accordance with inputs to said operational circuit, and different outputs of said operational circuit are set to the first level when the inputs to a logical operation changes next in said operational circuit.

7. The input circuit according to claim 1, wherein said controlled circuit selector circuit comprises a shift circuit having N pieces of flip-flops supplied with a common clock signal and connected in cascade.

8. The input circuit according to claim 1, wherein said controlled circuit selector circuit comprises an enable circuit at the output thereof for generating an output which is the same as an input when an enable signal is at the first level, and goes to the second level when the enable signal is at the second level.

9. A semiconductor integrated circuit comprising:
the input circuit according to claim 1; and said controlled circuit,
wherein said controlled circuit is changed in characteristics in accordance with a control signal supplied to said controlled circuit.

10. The semiconductor integrated circuit according to claim 9, wherein said N pieces of controlled circuits are supplied with respective optimal control signals by sequentially repeating, for said N pieces of control signal preservation/output circuits, a process of setting the trigger signal to any one of said control signal preservation/output circuits to the first level, changing the control signal for said controlled circuit corresponding to said any one of control signal preservation/output circuits by switching the group of input signals, while observing characteristics of said controlled circuit, to determine an optimal control signal for said controlled circuit, and setting the trigger signal to said any one of control signal preservation/output circuits to the second level after the determination.

* * * * *